(12) United States Patent
Fujino et al.

(10) Patent No.: US 12,374,376 B2
(45) Date of Patent: Jul. 29, 2025

(54) DECODER CIRCUITS USING SHARED TRANSISTORS FOR LOW-POWER, HIGH-SPEED, AND SMALL AREA

(71) Applicant: Taiwan Semiconductor Manufacturing Company, Ltd., Hsinchu (TW)

(72) Inventors: Yorinobu Fujino, Hsinchu (TW); Makoto Yabuuchi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 201 days.

(21) Appl. No.: 18/318,970

(22) Filed: May 17, 2023

(65) Prior Publication Data

US 2024/0386931 A1    Nov. 21, 2024

(51) Int. Cl.
*G11C 8/10*    (2006.01)

(52) U.S. Cl.
CPC .................................... *G11C 8/10* (2013.01)

(58) Field of Classification Search
CPC ........................................................ G11C 8/10
USPC ................................................... 365/230.06
See application file for complete search history.

(56) References Cited

U.S. PATENT DOCUMENTS

| 2006/0050575 | A1 | 3/2006 | Mastrangelo et al. |
| 2010/0177582 | A1* | 7/2010 | Kim .................... G11C 11/4096 365/207 |
| 2014/0078821 | A1 | 3/2014 | Hendrickson |
| 2014/0241101 | A1 | 8/2014 | Wu |
| 2021/0142849 | A1* | 5/2021 | Yabuuchi ............... G11C 5/146 |

FOREIGN PATENT DOCUMENTS

| EP | 0 928 003 A2 | 7/1999 |
| TW | 567487 B | 12/2003 |

OTHER PUBLICATIONS

Office Action issued in connection with Taiwan Appl. No. 112128889 dated Sep. 24, 2024.

* cited by examiner

*Primary Examiner* — Anthan Tran
(74) *Attorney, Agent, or Firm* — FOLEY & LARDNER LLP (57) ABSTRACT

Decoder devices and a method of operating word-line decoder devices are disclosed. In one aspect, a decoder device includes a first logic gate that receives a disable signal and a first input signal, and generates a first decoder output signal at a first output node. The decoder device includes a second logic gate that receives the disable signal and a second input signal, and generates a second decoder output signal at a second output node. The first logic gate and the second logic gate share a transistor. The transistor has a first terminal coupled to the first output node, a second terminal coupled to the second output node, and a gate terminal that receives the disable signal.

20 Claims, 6 Drawing Sheets

DECODER CIRCUITS USING SHARED TRANSISTORS FOR LOW-POWER, HIGH-SPEED, AND SMALL AREA

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Decoder circuits are electronic circuits that receive logical binary inputs and generate outputs correspond to a specific combination of inputs. One function of decoder circuits is to convert binary data from one format to another, typically from a coded input to a decoded output. Decoder circuits are used in various applications, including computer memory systems, digital communication systems, and multimedia systems. In computer memory systems, decoder circuits may be utilized as word-line decoders, which can be utilized to select a specific row of memory cells in the memory array for read or write operations.

Such decoders may utilize groups of transistors to form logical gates. These groups of transistors are defined in circuit designs wherever decoders are utilized. In memory circuits and in system-on-chip (SoC) devices, decoders are used frequently, and therefore occupy a significant portion of circuit area. Therefore, decoders having smaller areas are preferable. The systems and methods of the present disclosure provide decoder circuits that use shared transistors, and therefore have low-power, high-speed, and smaller area. Various implementations are described herein, including decoder circuits implemented using logical NAND configurations and logical NOR configurations. Example word-line decoders for memory circuits are also described herein.

It should be understood that the various encoder circuits described herein may be utilized as component parts that can be utilized, with additional appropriate logical circuits or transistors, to form encoders having an arbitrary number of inputs and corresponding outputs. For example, although FIGS. 1-5 describe various encoders having one or two inputs, the transistor sharing techniques described herein can be applied to create encoders having two inputs, three inputs, four inputs, eight inputs, or any suitable number of inputs and corresponding outputs. The encoders described herein may be utilized in connection with any type of circuit that may utilize an encoder, including memory circuits, clock control circuits, or other types of circuits.

Figure 1:
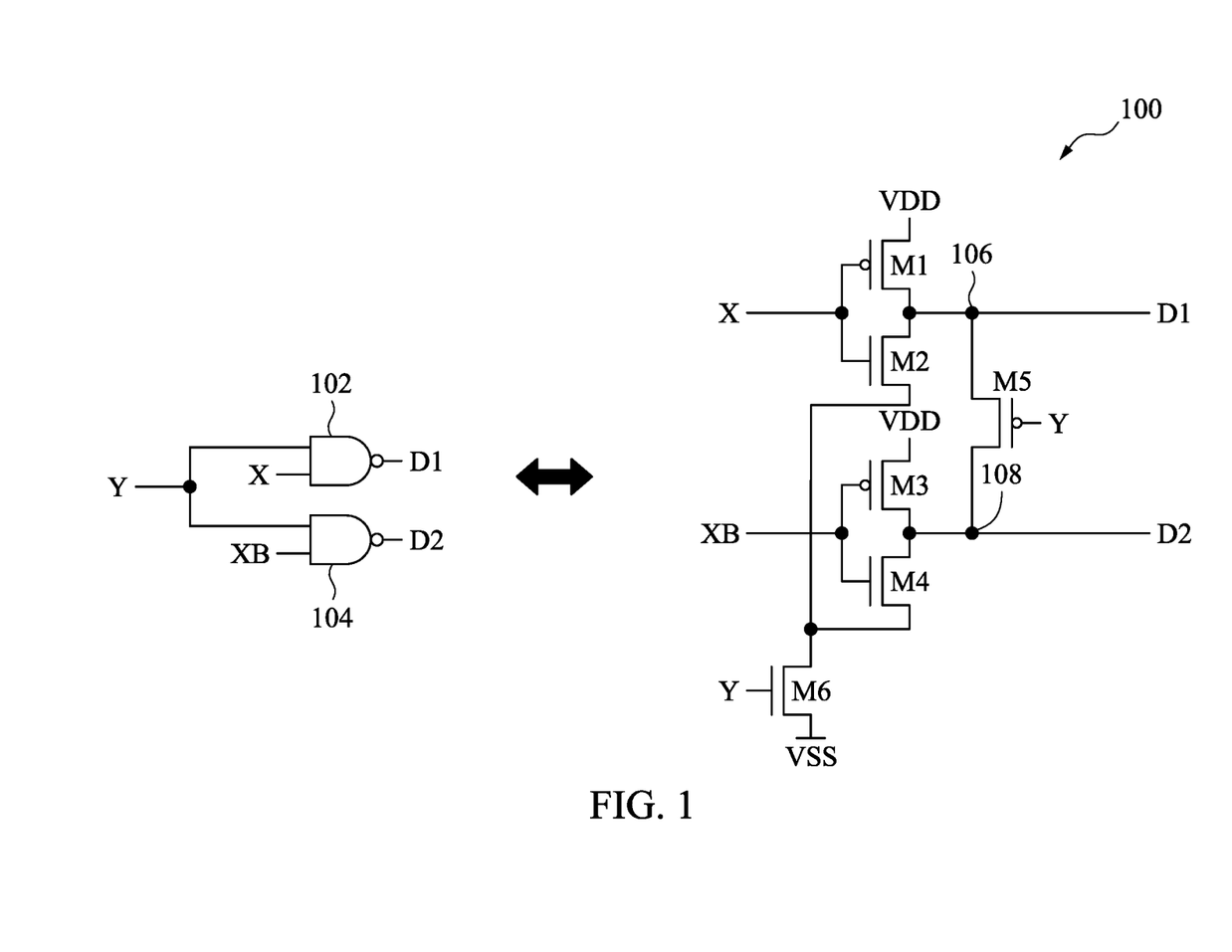
FIG. 1 illustrates a diagram of an example circuit having shared transistors to implement a NAND-based decoder, in accordance with some embodiments.

FIG. 1 illustrates a diagram of an example circuit 100 having shared transistors to implement a NAND-based decoder, in accordance with some embodiments. As shown, the NAND-based decoder is defined by a first NAND gate 102 and a second NAND gate 104. The inputs to the circuit include the logical input signal X and the logical input signal XB. In this example, the logical input signal XB is the logical inverse of the logical input signal X. The logical input signal Y is utilized as a logical disable signal.

As shown, the first NAND gate 102 receives the logical input signal X and the logical disable signal Y. The second NAND gate 104 receives the inverted input signal XB and the logical disable signal Y. The first NAND gate 102 generates the first decoder output signal D1 and the second NAND gate 104 generates the second decoder output signal D2. When the logical disable signal Y is logical low (e.g., having a voltage equivalent to a "logic 0"), the output signals D1 and D2 of first and second NAND gates 102 and 104 will be set to a disabled value (e.g., a logical 1). Otherwise, if the logical disable signal Y is set to logic high (e.g., having a voltage equivalent to a "logic 1"), the outputs D1 and D2 of the logical NAND gates 102 and 104 will be logical inverse of the input signal X and the input signal XB, respectively.

The circuit 100 implements the logical decoder utilizing the shared transistor M5. The circuit 100 generates the same logical outputs D1 and D2 based on the same logical inputs X and XB, and the logical disable signal Y. As shown, the circuit 100 is powered by the supply voltage VDD, which may be the "logical high" or "logic 1" voltage of the circuit, relative to the second voltage VSS, which may be the "logical low" or "logic 0" voltage of the circuit (e.g., a ground voltage). As shown, the circuit 100 includes six transistors M1, M2, M3, M4, M5, and M6. In some implementations, the inverted logical signal XB may be generated as an output of an inverter circuit, which may receive the logical input signal X and generate the logical inverse signal XB.

The various circuits described herein, including the circuit 100, include various transistors. The transistors described herein are shown to have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Furthermore, although each of the transistors M1-M6 of FIG. 1, M7-M12 of FIG. 2, M8-M22 of FIG. 3, M23-M30 of FIG. 4, and M31-M42 of FIG. 5 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals.

The circuit 100 includes transistors M1, M2, M3, M4, M5, and M6. In some implementations, the transistors M1, M3, and M5 each include a pMOSFET, and the transistors M2, M4, and M6 each include an nMOSFET. It is appreciated that each of the transistors M1-M6 can include any of various other types of transistors (e.g., bipolar junction transistors, high-electron-mobility transistors, etc.) while remaining within the scope of the present disclosure. The sources of the transistors M1 and M3 are electrically coupled with the supply voltage VDD. The drains of the transistors M1 and M3 are electrically coupled with the drains of the transistors M2 and M4, respectively.

As shown, the sources of each of the transistors M2 and M4 are electrically coupled to the drain of the transistor M6. The transistor M6 may be an NMOS footer transistor. The source of the transistor M6 is electrically coupled to the second voltage VSS, which may be ground voltage. The gates of the transistors M1 and M2 are electrically coupled to one another and connected to the logical input signal X. The gates of the transistors M3 and M4 are electrically coupled to one another and connected to the logical inverse of the input signal X, which as described herein is the inverted logical input signal XB.

The drains of the transistors M1 and M2 are electrically coupled to the first output node 106, which is the node via which the output signal D1 is generated. The drains of the transistors M3 and M4 are electrically coupled to the second output node 108, which is the node via which the output signal D2 is generated. As shown, the shared transistor M5 has a source connected to the first output node 106 and a drain connected to the second output node 108. The gate of the footer transistor M6 and the shared transistor M5 are connected to the logical disable signal Y.

When the logical disable signal Y is set to a logical high (e.g., logic 1, thereby enabling the decoder), the footer transistor M6 turns on, and conducts, and the shared transistor M5 turns off, and does not conduct. When the logical disable signal Y is logic high (e.g., enabling the decoder) and the logical input signal X is logic low (e.g., "logic 0"), the transistor M1 turns on and conducts, and the transistor M2 turns off and does not conduct. The voltage at the first output node 106 is therefore set to about the supply voltage VDD (e.g., a logical high state, logic 1).

When the logical input signal X is logic low, the inverse input signal XB is logic high. When the logical disable signal Y is logic high (e.g., enabling the decoder) and the inverse input signal XB is logic high (e.g., "logic 1"), the transistor M3 turns off and does not conduct, and the transistor M4 turns on and conducts. Because the transistor M6 is also turned on and conducting, the voltage at the second output node 108 is set to the voltage VSS (e.g., a logical low state, logical 0, the ground voltage, etc.). Current does not flow between the first and second output nodes 106 and 108 because the shared transistor M5 is turned off and not conducting when the disable signal Y is in the logic high state.

When the logical disable signal Y is logic high (e.g., enabling the decoder) and the logical input signal X is logic high (e.g., "logic 1"), the transistor M1 turns off and does not conduct, and the transistor M2 turns on and conducts. Because the footer transistor M6 is turned on and conducting, the voltage at the first output node 106 is set to about the second voltage VSS (e.g., a logical low state, logic 0). When the logical input signal X is logic high, the inverse input signal XB is logic low. When the logical disable signal Y is logic high (e.g., enabling the decoder) and the inverse input signal XB is logic low (e.g., "logic 0"), the transistor M3 turns on and conducts, and the transistor M4 turns off and does not conduct. The voltage at the second output node 108 is set to the supply voltage VDD (e.g., a logical high state, logical 1). Current does not flow between the first and second output nodes 106 and 108 because the shared transistor M5 is turned off and not conducting when the disable signal Y is in the logic high state.

When the logical disable signal Y is set to a logical low (e.g., logic 0, thereby disabling the decoder), the footer transistor M6 turns off and does not conduct, and the shared transistor M5 turns on and conducts. When the logical disable signal Y is logic low (e.g., disabling the decoder) and the logical input signal X is logic low (e.g., "logic 0"), the transistor M1 turns on and conducts, and the transistor M2 turns off and does not conduct. The voltage at the first output node 106 is therefore set to about the supply voltage VDD (e.g., a logical high state, logic 1).

When the logical input signal X is logic low, the inverse input signal XB is logic high. When the logical disable signal Y is logic low (e.g., disabling the decoder) and the inverse input signal XB is logic high (e.g., "logic 1"), the transistor M3 turns off and does not conduct, and the transistor M4 turns on and conducts. However, the transistor M6 is also turned off because the disable signal Y is logic low. Current flows between the first and second output nodes 106 and 108 because the shared transistor M5 is turned on and conducting, therefore setting the voltage at the second output node 108 to logic high (e.g., the voltage VDD).

When the logical disable signal Y is logic low (e.g., disabling the decoder) and the logical input signal X is logic high (e.g., "logic 1"), the transistor M1 turns off and does not conduct, and the transistor M2 turns on and conducts. However, the footer transistor M6 is turned off and not conducting, and therefore current does not flow through the transistor M2. When the logical input signal X is logic high, the inverse input signal XB is logic low. When the logical disable signal Y is logic low (e.g., disabling the decoder) and the inverse input signal XB is logic low (e.g., "logic 0"), the transistor M3 turns on and conducts, and the transistor M4 turns off and does not conduct. The voltage at the second output node 108 is set to the supply voltage VDD (e.g., a logical high state, logical 1). Current flows between the first and second output nodes 106 and 108 because the shared transistor M5 is turned on and conducting when the disable signal Y is in the logic low state. The voltages at the first output node 106 and the second output node 108 (the outputs D1 and D2) are therefore set to logic high regardless of the logical state of the input signal X when the disable signal Y is set to logical low (e.g., disabling the decoder).

Figure 2:
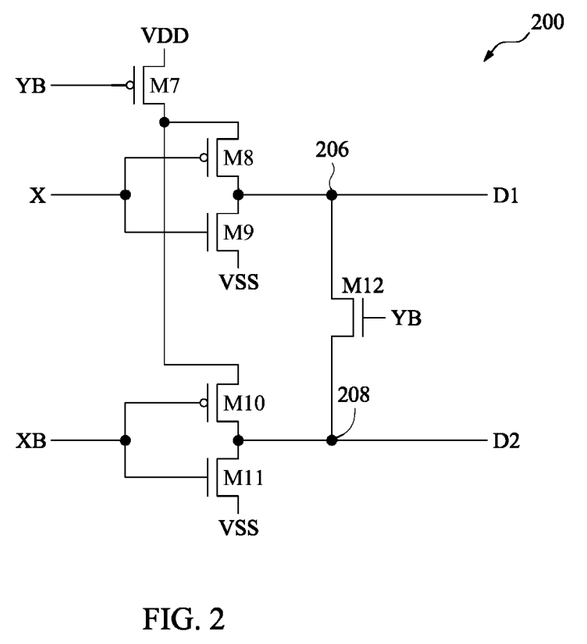
FIG. 2 illustrates a diagram of an example circuit having shared transistors to implement a NOR-based decoder, in accordance with some embodiments.

FIG. 2 illustrates a diagram of an example circuit 200 having a shared transistor M12 to implement a NOR-based decoder, in accordance with some embodiments. The decoder shown in the circuit 200 may be similar to the circuit 100 shown in FIG. 1, but implemented utilizing NOR gates. As shown, the circuit 200 includes the transistors M7, M8, M9, M10, M11, and M12. In some implementations, the transistors M7, M8, and M10 each include a pMOSFET, and the transistors M9, M11, and M12 each include an nMOSFET. It is appreciated that each of the transistors M7-M12 can include any of various other types of transistors (e.g., bipolar junction transistors, high-electron-mobility transistors, etc.) while remaining within the scope of the present disclosure.

The sources of the transistors M9 and M11 are electrically coupled with the voltage VSS (e.g., the logic low voltage, the ground voltage, etc.). The drains of the transistors M8 and M10 are electrically coupled with the drains of the transistors M9 and M11, respectively. As shown, the sources of each of the transistors M8 and M19 are electrically coupled to the drain of the transistor M7. The source of the transistor M7 is electrically coupled to the supply voltage VDD (e.g., the logic high voltage). The gates of the transistors M8 and M9 are electrically coupled to one another and connected to the logical input signal X. The gates of the transistors M10 and M11 are electrically coupled to one another and connected to the logical inverse of the input signal X, which as described herein is the logical inverted input signal XB.

The drains of the transistors M8 and M9 are electrically coupled to the first output node 206, which is the node via which the output signal D1 is generated. The drains of the transistors M10 and M11 are electrically coupled to the second output node 208, which is the node via which the output signal D2 is generated. As shown, the shared transistor M12 has a source connected to the second output node 208 and a drain connected to the first output node 206. The gate of the transistor M7 and the shared transistor M12 are connected to the inverse of the logical disable signal Y, shown here as the inverse disable signal YB.

When the inverse disable signal YB is set to a logical low (e.g., logic 0, thereby enabling the decoder), the transistor M7 turns on and conducts, and the shared transistor M12 turns off and does not conduct. When the inverse disable signal YB is logic low (e.g., enabling the decoder) and the logical input signal X is logic low (e.g., "logic 0"), the transistor M8 turns on and conducts, and the transistor M9 turns off and does not conduct. The voltage at the first output node 206 is therefore set to about the supply voltage VDD (e.g., a logical high state, logic 1), from the current flowing through the transistor M7 and the transistor M8.

When the logical input signal X is logic low, the inverse input signal XB is logic high. When the inverse disable signal YB is logic low (e.g., enabling the decoder) and the inverse input signal XB is logic high (e.g., "logic 1"), the transistor M10 turns off and does not conduct, and the transistor M11 turns on and conducts. The voltage at the second output node 108 is therefore set to the voltage VSS (e.g., a logical low state, logical 0, the ground voltage, etc.). Current does not flow between the first and second output nodes 206 and 208 because the shared transistor M12 is turned off and not conducting when the inverse disable signal YB is in the logic low state.

When the inverse disable signal YB is logic low (e.g., enabling the decoder) and the logical input signal X is logic high (e.g., "logic 1"), the transistor M8 turns off and does not conduct, and the transistor M9 turns on and conducts. The voltage at the first output node 206 is therefore set to about the voltage VSS (e.g., a logical low state, logic 0). When the logical input signal X is logic high, the inverse input signal XB is logic low. When the inverse disable signal YB is logic low (e.g., enabling the decoder) and the inverse input signal XB is logic low (e.g., "logic 0"), the transistor M10 turns on and conducts, and the transistor M11 turns off and does not conduct. Because the transistor M7 is on and conducting, the voltage at the second output node 208 is set to the supply voltage VDD (e.g., a logical high state, logical 1). Current does not flow between the first and second output nodes 206 and 208 because the shared transistor M12 is turned off and not conducting when the inverse disable signal YB is in the logic low state.

When the inverse disable signal YB is set to a logical high (e.g., logic 1, thereby disabling the decoder), the transistor M7 turns off and does not conduct, and the shared transistor M12 turns on and conducts. When the inverse disable signal YB is logic high (e.g., disabling the decoder) and the logical input signal X is logic low (e.g., "logic 0"), the transistor M8 turns on and conducts, and the transistor M9 turns off and does not conduct. However, the transistor M6 is also turned off because the inverse disable signal YB is logic high.

When the logical input signal X is logic low, the inverse input signal XB is logic high. When the inverse disable signal YB is logic high (e.g., disabling the decoder) and the inverse input signal XB is logic high (e.g., "logic 1"), the transistor M10 turns off and does not conduct, and the transistor M11 turns on and conducts. This sets the voltage at the second output node 208 to the voltage VSS (e.g., logic low, logic 0). Current flows between the first and second output nodes 206 and 208 because the shared transistor M12 is turned on and conducting, therefore setting the voltage at the first output node 206 to logic low (e.g., the voltage VSS).

When the inverse disable signal YB is logic high (e.g., disabling the decoder) and the logical input signal X is logic high (e.g., "logic 1"), the transistor M8 turns off and does not conduct, and the transistor M9 turns on and conducts. This causes the voltage at the first output node 206 to be set to about the voltage VSS (e.g., the logic low state, logic 0). When the logical input signal X is logic high, the inverse input signal XB is logic low. When the inverse disable signal YB is logic high (e.g., disabling the decoder) and the inverse input signal XB is logic low (e.g., "logic 0"), the transistor M10 turns on and conducts, and the transistor M11 turns off and does not conduct. However, the transistor M7 is turned off and not conducting, and therefore current does not flow through the transistor M7 or the transistor M10. Current flows between the first and second output nodes 206 and 208 because the shared transistor M12 is turned on and conducting when the inverse disable signal YB is in the logic high state. The voltage at the second output node 208 is therefore set to the voltage VSS (e.g., a logical low state, logical 0). The voltages at the first output node 206 and the second output node 208 (the outputs D1 and D2) are therefore set to logic low regardless of the logical state of the input signal X when the inverse disable signal YB is set to logical high (e.g., disabling the decoder).

Figure 3:
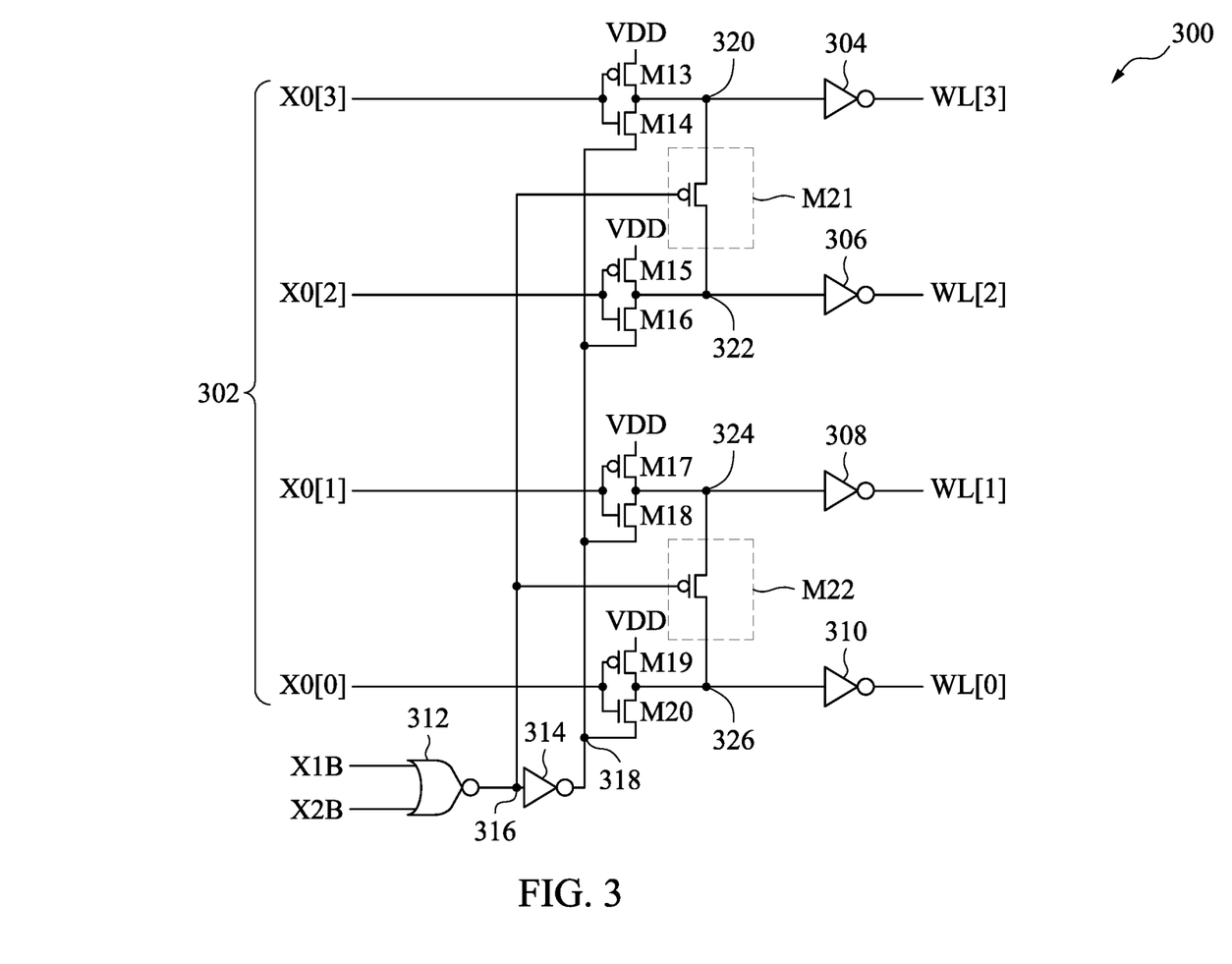
FIG. 3 illustrates a diagram of an example circuit having shared transistors to implement a word-line decoder, in accordance with some embodiments.

FIG. 3 illustrates a diagram of an example circuit 300 having shared transistors to implement a word-line decoder, in accordance with some embodiments. As shown, the circuit 300 includes a NOR gate 312 that receives the input signals X1B and X2B. The input signals X1B and X2B can be block-selected signals for the word line decoder. When the input signal X1B is logic low (e.g., VSS, ground voltage, logic 0, etc.) and the input signal X2B is logic low, the NOR gate 312 generates a logic high (e.g., about VDD, logic 1, etc.) signal at the node 316. When the input signal X1B is logic high and the input signal X2B is logic low, the NOR gate 312 generates a logic low signal at the node 316.

When the input signal X1B is logic low and the input signal X2B is logic high, the NOR gate 312 generates a logic low signal at the node 316. When the input signal X1B is logic high and the input signal X2B is logic high, the NOR gate 312 generates a logic low signal at the node 316. The circuit 300 includes an inverter 314, which receives the output of the NOR gate 312 at the node 316. When the node 316 is logic low, the inverter 314 generates a logic high signal at the node 318. When the node 316 is logic high, the inverter 314 generates a logic low signal at the node 318.

The circuit 300 implements the word-line decoder utilizing the shared transistors M21 and M22. As shown, the circuit 300 is powered by the supply voltage VDD, which may be the "logical high" or "logic 1" voltage of the circuit. The logic high voltage may be relative to a second logic low voltage (e.g., a ground voltage, VSS as described herein, etc.). As shown, the circuit 300 includes ten transistors M13, M14, M15, M16, M17, M18, M19, M20, M21, and M22. The word-line decoder receives the word-line clock signal 302. The word-line clock signal 302 can be a one-hot clock signal having four input clock signals X0[0], X0[1], X0[2], and X0[3], each of which respectively correspond to a word-line selection output signal WL[0], WL[1], WL[2], and WL[3]. In this example, the word lines WL[0], WL[1], WL[2], and WL[3] are selected when the block-selected signal X1B is logic low and the block-selected signal X2B is logic low (e.g., block-selected signal "00").

The circuit 300 includes the inverters 304, 306, 308, and 310. The inverters 304, 306, 308, and 310 receive the voltage generate at the output nodes 320, 322, 324, and 326, respectively, and generate the corresponding word-lines selection signals WL[0], WL[1], WL[2], and WL[3] as the output of the circuit 300. As shown, the circuit 300 includes ten transistors M13, M14, M15, M16, M17, M18, M19, M20, M21, and M22. In some implementations, the transistors M13, M15, M17, M19, M21, and M22 each include a pMOSFET, and the transistors M14, M16, M18, and M20 each include an nMOSFET. It is appreciated that each of the transistors M13-M22 can include any of various other types of transistors (e.g., bipolar junction transistors, high-electron-mobility transistors, etc.) while remaining within the scope of the present disclosure.

The sources of the transistors M13, M15, M17, and M19 are electrically coupled with the supply voltage VDD. The sources of the transistors M14, M16, M18, and M20 are electrically coupled with the output of the inverter 314 at the node 318. When either or both of the input signals X1B and X2B are logic high, the NOR gate 312 generates a logic low signal at the node 316, and the inverter 314 generates a logic high signal at the node 318 (de-selecting the word-lines WL[0], WL[1], WL[2], and WL[3], and effectively disabling this portion of the word-line decoder). Additionally, setting the node 316 to a logic low signal turns on both the shared transistors M21 and M22, causing current to flow between the nodes 320 and 322, and between the nodes 324 and 326, respectively. When both of the input signals X1B and X2B are logic low, the voltage at the node 318 is logic low, which enables the output of the word-lines WL[0], WL[1], WL[2], and WL[3], effectively enabling the decoder. This causes the voltage at the node 316 to be logic high, turning off the shared transistors M21 and M22, and preventing current from flowing between the nodes 320 and 322, and between the nodes 324 and 326, respectively.

As shown, the drains of the transistors M13, M15, M17, and M19 are electrically coupled with the drains of the transistors M14, M16, M18, and M20, respectively. When the node 318 is in the logic high state (disabling the decoder), current does not flow through the transistors M14, M16, M18, and M20 regardless of the logic state of the input clock signals X0[0], X0[1], X0[2], and X0[3]. Because the input clock signals are one-hot clock signals, at most one of the input clock signals X0[0], X0[1], X0[2], and X0[3] can be in the logic high state while the other three are in the logic low state. In some implementations, all of the input clock signals X0[0], X0[1], X0[2], and X0[3] may be in the logic low state.

In the disabled state (e.g., the node 316 in a logic low state and the node 318 in a logic high state, caused by either or both block-selected signals X1B or X2B being in a logic high state), if any of transistors M13, M15, M17, or M19 are turned on by any of the clock input signals X0[0], X0[1], X0[2], and X0[3] respectively being in the logic low state, the voltage at the output nodes 320, 322, 324, or 326 will be in the logic high state.

Because the shared transistors M21 and M22 are both turned on, and because the transistors M14, M16, M18, and M20 are not conducting, the voltage at the node 322 will be set to be about equal to the voltage at the node 320, and the voltage at the node 324 will be set to be about equal to the voltage at the node 326. Due to the input clock signals X0[0], X0[1], X0[2], and X0[3] being one-hot signals, at least one of the nodes 320 and 322, and at least one of the nodes 324 and 326, will be set to a logic high state. The shared transistors M21 and M22 being turned on and conducting causes the other of the nodes 320 and 322 and the other of the nodes 324 and 326 to be set to the logic high state. Therefore, in the disabled state (e.g., the node 316 in a logic low state and the node 318 in a logic high state, caused by either or both block-selected signals X1B or X2B being in a logic high state), all of the nodes 320, 322, 324, and 326 will be set to the logic high state. This causes the inverters to generate logic low signals for each of the output word-lines WL[0], WL[1], WL[2], and WL[3].

In the enabled state (e.g., the node 316 in a logic high state and the node 318 in a logic low state, caused by either or both block-selected signals X1B or X2B being in a logic high state), the input clock signals X0[0], X0[1], X0[2], and X0[3] can be utilized to generate corresponding word-line select output signals for word-lines WL[0], WL[1], WL[2], and WL[3]. If the input clock signal X0[0] signal is logic high, and the input signals X0[1], X0[2], and X0[3] are logic low in the enabled state, the transistor M19 turns off and does not conduct, and the transistor M20 turns on and conducts, generating a logic low voltage at the node 326, and causing the inverter 310 to generate a WL[0] output voltage of logic high. Additionally, the transistors M13, M15, and M17 are turned on and conduct, while the transistors M14, M16, and M18 turn off and do not conduct, generating logic high voltages at the nodes 320, 322, and 324, respectively. This causes the inverters 304, 306, and 308 to generate logic low signals for each of the WL[3], WL[2], and WL[1] outputs, respectively.

If the X0[1] signal is logic high, and the input signals X0[0], X0[2], and X0[3] are logic low in the enabled state, the transistor M17 turns off and does not conduct, and the transistor M18 turns on and conducts, generating a logic low voltage at the node 324, and causing the inverter 308 to generate a WL[1] output voltage of logic high. Additionally, the transistors M13, M15, and M19 are turned on and conduct, while the transistors M14, M16, and M20 turn off and do not conduct, generating logic high voltages at the nodes 320, 322, and 326, respectively. This causes the inverters 304, 306, and 310 to generate logic low signals for each of the WL[3], WL[2], and WL[0] outputs, respectively.

If the X0[2] signal is logic high, and the input signals X0[0], X0[1], and X0[3] are logic low in the enabled state, the transistor M15 turns off and does not conduct, and the transistor M16 turns on and conducts, generating a logic low voltage at the node 322, and causing the inverter 306 to generate a WL[2] output voltage of logic high. Additionally, the transistors M13, M17, and M19 are turned on and conduct, while the transistors M14, M18, and M20 turn off and do not conduct, generating logic high voltages at the nodes 320, 324, and 326, respectively. This causes the inverters 304, 308, and 310 to generate logic low signals for each of the WL[3], WL[1], and WL[0] outputs, respectively.

If the X0[3] signal is logic high, and the input signals X0[0], X0[1], and X0[2] are logic low in the enabled state, the transistor M13 turns off and does not conduct, and the transistor M14 turns on and conducts, generating a logic low voltage at the node 320, and causing the inverter 304 to generate a WL[3] output voltage of logic high. Additionally, the transistors M15, M17, and M19 are turned on and conduct, while the transistors M16, M18, and M20 turn off and do not conduct, generating logic high voltages at the nodes 322, 324, and 326, respectively. This causes the inverters 306, 308, and 310 to generate logic low signals for each of the WL[2], WL[1], and WL[0] outputs, respectively.

If the input clock signals X0[0], X0[1], X0[2], and X0[3] are all logic low in the enabled state, the transistors M13, M15, M17, and M19 turn on and conduct, and the transistors M14, M16, M18, and 20 turn off and do not conduct, causing logic high voltages to be generated at each of the nodes 320, 322, 324, and 326. This causes the inverters 304, 306, 308, and 310 to generate logic low signals for each of the WL[3], WL[2], WL[1], and WL[0] outputs, respectively, deselecting all word lines.

Figure 4:
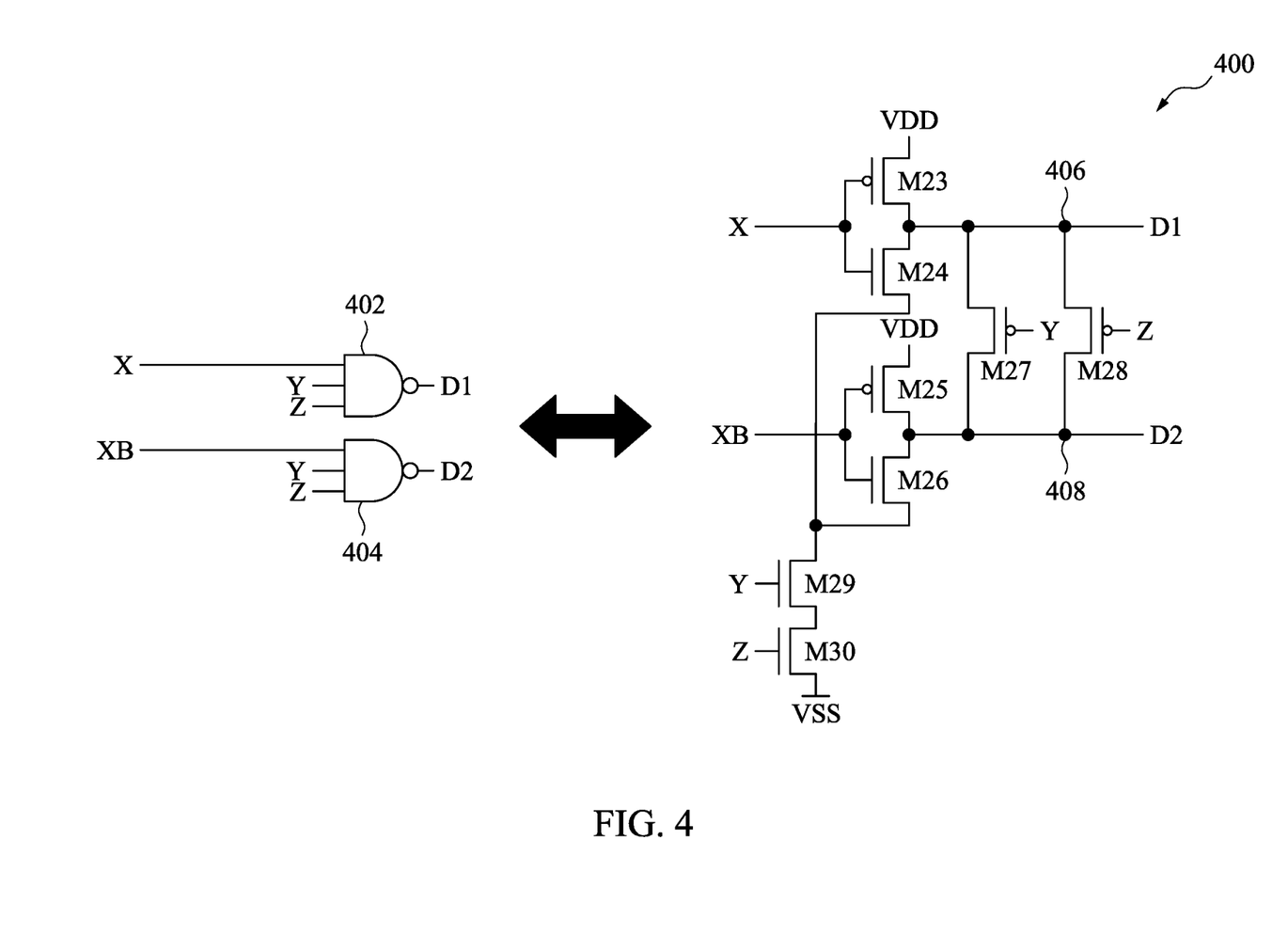
FIG. 4 illustrates a diagram of an example circuit having shared transistors to implement a three-input NAND-based decoder, in accordance with some embodiments.
Figure 5:
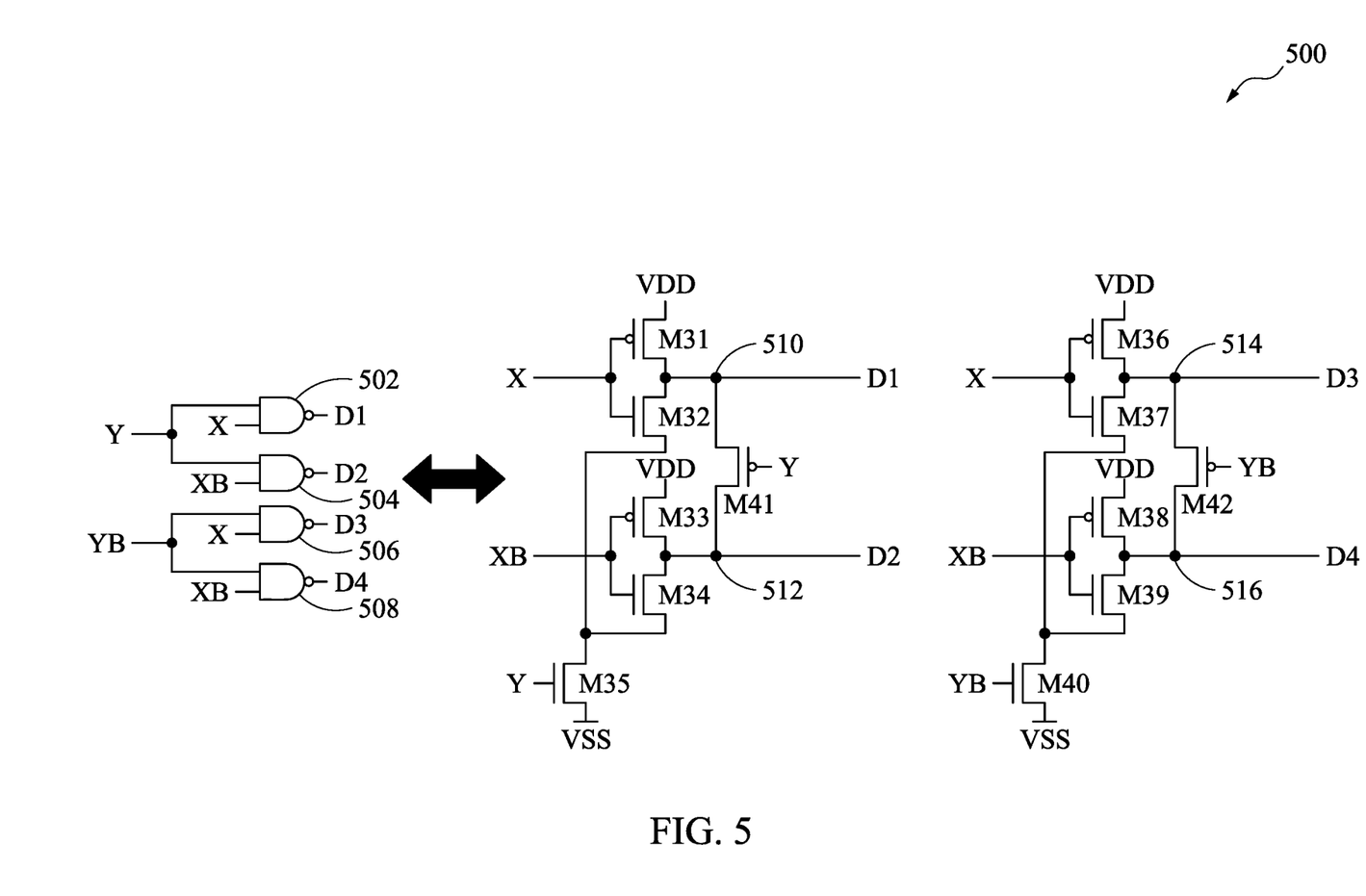
FIG. 5 illustrates a diagram of an example circuit having shared transistors to implement a two-input, four-output, NAND-based decoder, in accordance with some embodiments.

FIG. 4 illustrates a diagram of an example circuit 400 having shared transistors M27 and M28 to implement a three-input NAND-based decoder, in accordance with some embodiments. The circuit 400 may be implemented such that the decoder operates when both the input signal Y and the input signal Z are logical high. As shown, the three-input NAND-based decoder is defined by a first NAND gate 402 and a second NAND gate 404. The inputs to the circuit include the logical input signal X, the logical input signal XB, and the input signals Y and Z. In this example, the logical input signal XB is the logical inverse of the logical input signal X. The logical input signals Y and Z are utilized in combination as a logical disable signal.

As shown, the first NAND gate 402 receives the logical input signal X and the logical disable signals Y and Z. The second NAND gate 404 receives the inverted input signal XB and the logical disable signals Y and Z. The first NAND gate 402 generates the first decoder output signal D1 and the second NAND gate 404 generates the second decoder output signal D2. When either or both logical disable signals Y and Z are logical low (e.g., having a voltage equivalent to a "logic 0"), the output signals D1 and D2 of first and second NAND gates 402 and 404 will be set to a disabled value (e.g., a logical 1). Otherwise, if both logical disable signals Y and Z are set to logic high (e.g., having a voltage equivalent to a "logic 0"), the outputs D1 and D2 of the logical NAND gates 402 and 404 will be logical inverse of the input signal X and the input signal XB, respectively.

The circuit 400 implements the logical decoder utilizing the shared transistors M27 and M28. The circuit 400 generates the same logical outputs D1 and D2 based on the same logical inputs X and XB, and the logical disable signals Y and Z. As shown, the circuit 400 is powered by the supply voltage VDD, which may be the "logical high" or "logic 1" voltage of the circuit, relative to the second voltage VSS, which may be the "logical low" or "logic 0" voltage of the circuit (e.g., a ground voltage). As shown, the circuit 400 includes eight transistors M23, M24, M25, M26, M27, M28, M29, and M30. In some implementations, the inverted logical signal XB may be generated as an output of an inverter circuit, which may receive the logical input signal X and generate the inverted signal XB.

The circuit 400 includes transistors M23, M24, M25, M26, M27, M28, M29, and M30. In some implementations, the transistors M23, M25, M27, and M28 each include a pMOSFET, and the transistors M24, M26, M29, and M30 each include an nMOSFET. It is appreciated that each of the transistors M23-M30 can include any of various other types of transistors (e.g., bipolar junction transistors, high-electron-mobility transistors, etc.) while remaining within the scope of the present disclosure. The sources of the transistors M23 and M25 are electrically coupled with the supply voltage VDD. The drains of the transistors M23 and M25 are electrically coupled with the drains of the transistors M24 and M26, respectively.

As shown, the sources of each of the transistors M24 and M26 are electrically coupled to the drain of the transistor M29. The transistor M29 is in series with the transistor M30. The source of the transistor M30 is electrically coupled to the second voltage VSS, which may be ground voltage. The gates of the transistors M23 and M24 are electrically coupled to one another and connected to the logical input signal X. The gates of the transistors M25 and M26 are electrically coupled to one another and connected to the logical inverse of the input signal X, which as described herein is the inverted logical input signal XB.

The drains of the transistors M23 and M24 are electrically coupled to the first output node 406, which is the node via which the output signal D1 is generated. The drains of the transistors M25 and M26 are electrically coupled to the second output node 408, which is the node via which the output signal D2 is generated. As shown, the shared transistors M27 and M28 are in parallel, and each have a respective source connected to the first output node 406 and a respective drain connected to the second output node 408. The gates of the transistors M27 and M29 are connected to the first logical disable signal Y, and the gates of the transistors M28 and M30 are connected to the second logical disable signal Z.

When the logical disable signals Y and Z are both set to a logical high (e.g., logic 1, thereby enabling the decoder), the transistors M29 and M30 turn on and conduct, and the shared transistors M27 and M28 turn off and do not conduct. When the logical disable signals Y and Z are both logic high (e.g., enabling the decoder) and the logical input signal X is logic low (e.g., "logic 0"), the transistor M23 turns on and conducts, and the transistor M24 turns off and does not conduct. The voltage at the first output node 406 is therefore set to about the supply voltage VDD (e.g., a logical high state, logic 1).

When the logical input signal X is logic low, the inverse input signal XB is logic high. When the logical disable signals Y and Z are logic high (e.g., enabling the decoder) and the inverse input signal XB is logic high (e.g., "logic 1"), the transistor M25 turns off and does not conduct, and the transistor M26 turns on and conducts. Because the transistors M29 and M30 are also turned on and conducting based on the logical disable signals Y and Z being logic high, the voltage at the second output node 408 is set to the voltage VSS (e.g., a logical low state, logical 0, the ground voltage, etc.). Current does not flow between the first and second output nodes 406 and 408 because the shared transistors M27 and M28 are turned off and not conducting when the disable signals Y and Z are in the logic high state.

When the logical disable signals Y and Z are logic high (e.g., enabling the decoder) and the logical input signal X is logic high (e.g., "logic 1"), the transistor M23 turns off and does not conduct, and the transistor M24 turns on and conducts. Because the transistors M29 and M30 is turned on and conducting, the voltage at the first output node 406 is set to about the second voltage VSS (e.g., a logical low state, logic 0). When the logical input signal X is logic high, the inverse input signal XB is logic low. When the logical disable signals Y and Z are logic high (e.g., enabling the decoder) and the inverse input signal XB is logic low (e.g., "logic 0"), the transistor M25 turns on and conducts, and the transistor M26 turns off and does not conduct. The voltage at the second output node 408 is set to the supply voltage VDD (e.g., a logical high state, logical 1). Current does not flow between the first and second output nodes 406 and 408 because the shared transistors M27 and M28 are turned off and not conducting when the disable signals Y and Z in the logic high state, respectively.

When either or both of the logical disable signals Y or Z are set to a logical low (e.g., logic 0, thereby disabling the decoder), either or both the transistors M29 (if Y is logic low) or M30 (if Z is logic low) turn off and do not conduct. Additionally, either or both of the shared transistors M27 (if Y is logic low) or M28 (if Z is logic low) turn on and conducts. When either or both of the logical disable signals Y or Z are set to a logical low (e.g., disabling the decoder) and the logical input signal X is logic low (e.g., "logic 0"), the transistor M23 turns on and conducts, and the transistor M24 turns off and does not conduct. The voltage at the first output node 406 is therefore set to about the supply voltage VDD (e.g., a logical high state, logic 1).

When the logical input signal X is logic low, the inverse input signal XB is logic high. When either or both of the logical disable signals Y or Z are set to a logical low (e.g., disabling the decoder) and the inverse input signal XB is logic high (e.g., "logic 1"), the transistor M25 turns off and does not conduct, and the transistor M26 turns on and conducts. However, either or both transistors M29 or M30 are also turned off because either or both disable signals Y or Z, respectively, is logic low. Current flows between the first and second output nodes 406 and 408 because either or both shared transistors M27 or M28 are turned on and conducting, therefore setting the voltage at the second output node 408 to logic high (e.g., the voltage VDD).

When either or both of the logical disable signals Y or Z are set to a logical low (e.g., disabling the decoder) and the logical input signal X is logic high (e.g., "logic 1"), the transistor M23 turns off and does not conduct, and the transistor M24 turns on and conducts. However, either or both transistors M29 (if logical disable signal Y is logical low) or M30 (if logical disable signal Z is logical low) are turned off and not conducting, and therefore current does not flow through the transistor M24. When the logical input signal X is logic high, the inverse input signal XB is logic low. When either or both of the logical disable signals Y or Z are set to a logical low (e.g., disabling the decoder) and the inverse input signal XB is logic low (e.g., "logic 0"), the transistor M25 turns on and conducts, and the transistor M26 turns off and does not conduct. The voltage at the second output node 408 is set to the supply voltage VDD (e.g., a logical high state, logical 1). Current flows between the first and second output nodes 406 and 408 because either or both of the shared transistors M27 (if logical disable signal Y is logical low) or M28 (if logical disable signal Z is logical low) is turned on and conducting. The voltages at the first output node 406 and the second output node 408 (the outputs D1 and D2) are therefore set to logic high regardless of the logical state of the input signal X when either or both disable signals Y or Z are set to logical low (e.g., disabling the decoder).

FIG. 5 illustrates a diagram of an example circuit 500 having shared transistors M41 and M42 to implement a two-input, four-output, NAND-based decoder, in accordance with some embodiments. As shown, the two-input NAND-based decoder is defined by a first NAND gate 502, a second NAND gate 504, a third NAND gate 506, and a fourth NAND gate 508. The inputs to the circuit include the logical input signal X, the inverse logical input signal XB, the logical input signal Y, and the inverse logical input signal YB. In this example two-input decoder, the inputs may be the input signal X and the input signal Y, the inverse input signal XB is the logical inverse of the logical input signal X, and the inverse input signal YB is the logical inverse of the logical input signal Y.

As shown, the first NAND gate 502 receives the logical input signal X and the logical input signal Y. The second NAND gate 504 receives the inverted input signal XB and the logical input signal Y. The third NAND gate 506 receives the logical input signal X and the inverse input signal YB. The fourth NAND gate 508 receives the inverted input signal XB and the inverse input signal YB. The first NAND gate 502 generates the first decoder output signal D1, the second NAND gate 504 generates the second decoder output signal D2, the third NAND gate 506 generates the third decoder output signal D3, and the fourth NAND gate 508 generates the fourth decoder output signal D4.

When the logical input signal Y is logical low (e.g., having a voltage equivalent to a "logic 0") and the logical input signal X is logical low, the output signal D1 is logic high, the output signal D2 is logic high, the output signal D3 is logic high, and the output signal D4 is logic low. When the logical input signal Y is logical low (e.g., having a voltage equivalent to a "logic 0") and the logical input signal X is logical high, the output signal D1 is logic high, the output signal D2 is logic high, the output signal D3 is logic low, and the output signal D4 is logic high. When the logical input signal Y is logical high (e.g., having a voltage equivalent to a "logic 0") and the logical input signal X is logical low, the output signal D1 is logic high, the output signal D2 is logic low, the output signal D3 is logic high, and the output signal D4 is logic low. When the logical input signal Y is logical high (e.g., having a voltage equivalent to a "logic 0") and the logical input signal X is logical high, the output signal D1 is logic low, the output signal D2 is logic high, the output signal D3 is logic high, and the output signal D4 is logic high.

The circuit 500 implements the logical decoder utilizing the shared transistors M41 and M42. The circuit 500 generates the same logical outputs D1, D2, D3, and D4 based on the same logical inputs X and XB, and the logical input signals Y and YB. As shown, the circuit 500 is powered by the supply voltage VDD, which may be the "logical high" or "logic 1" voltage of the circuit, relative to the second voltage VSS, which may be the "logical low" or "logic 0" voltage of the circuit (e.g., a ground voltage). As shown, the circuit 500 includes twelve transistors M31, M32, M33, M34, M35, M36, M37, M38, M39, M40, M41, and M42. In some implementations, the inverted logical signal XB may be generated as an output of an inverter circuit, which may receive the logical input signal X and generate the logical inverse signal XB. In some implementations, the inverted logical signal YB may be generated as an output of an inverter circuit, which may receive the logical input signal Y and generate the logical inverse signal YB.

The circuit 500 includes transistors M31, M32, M33, M34, M35, M36, M37, M38, M39, M40, M41, and M42. In some implementations, the transistors M31, M33, M41, M36, M38, and M42 each include a pMOSFET, and the transistors M32, M34, M35, M37, M39, and M40 each include an nMOSFET. It is appreciated that each of the transistors M31-M42 can include any of various other types of transistors (e.g., bipolar junction transistors, high-electron-mobility transistors, etc.) while remaining within the scope of the present disclosure. The sources of the transistors M31, M33, M36, and M38 are electrically coupled with the supply voltage VDD. The drains of the transistors M31 and M33 are electrically coupled with the drains of the transistors M32 and M34, respectively, and the drains of the transistors M36 and M38 are electrically coupled with the drains of the transistors M37 and M39, respectively.

The operation of the portion of the circuit 500 including the transistors M31, M32, M33, M34, M35, and M41 is similar to the operation of the portion of the circuit 500 including the transistors M36, M37, M38, M39, M40, and M42. The portion of the circuit 500 that generates the output signals D1 and D2 at the output nodes 510 and 512, respectively, receives the logical input signals X and Y, and the inverse logical signal XB. The portion of the circuit 500 that generates the output signals D3 and D4 at the output nodes 514 and 516, respectively, receives the logical input signal X, and the inverse logical signals XB and YB.

As shown, the sources of each of the transistors M32 and M34 are electrically coupled to the drain of the transistor M35. The transistor M35 may be an NMOS footer transistor. The source of the transistor M35 is electrically coupled to the second voltage VSS, which may be ground voltage. The gates of the transistors M31 and M32 are electrically coupled to one another and connected to the logical input signal X. The gates of the transistors M33 and M34 are electrically coupled to one another and connected to the logical inverse of the input signal X, which as described herein is the inverted logical input signal XB.

The drains of the transistors M41 and M42 are electrically coupled to the first output node 510, which is the node via which the output signal D1 is generated. The drains of the transistors M33 and M34 are electrically coupled to the second output node 512, which is the node via which the output signal D2 is generated. As shown, the shared transistor M41 has a source connected to the first output node 510 and a drain connected to the second output node 512. The gate of the footer transistor M35 and the shared transistor M41 are connected to the logical input signal Y.

As shown, the sources of each of the transistors M37 and M39 are electrically coupled to the drain of the transistor M40. The transistor M40 may be an NMOS footer transistor. The source of the transistor M40 is electrically coupled to the second voltage VSS, which may be ground voltage. The gates of the transistors M36 and M37 are electrically coupled to one another and connected to the logical input signal X. The gates of the transistors M38 and M39 are electrically coupled to one another and connected to the logical inverse of the input signal X, which as described herein is the inverted logical input signal XB.

The drains of the transistors M41 and M42 are electrically coupled to the third output node 514, which is the node via which the output signal D3 is generated. The drains of the transistors M38 and M39 are electrically coupled to the fourth output node 516, which is the node via which the output signal D4 is generated. As shown, the shared transistor M41 has a source connected to the third output node 514 and a drain connected to the fourth output node 516. The gate of the footer transistor M40 and the shared transistor M42 are connected to the inverse input signal YB.

When the logical input signal Y is set to a logical high, the inverse input signal YB is set to logic low. Therefore, the footer transistor M35 turns on and conducts, the footer transistor M40 turns off and does not conduct, the shared transistor M41 turns off and does not conduct, and the shared transistor M42 turns on and conducts. When the logical input signal Y is logic high, the inverse input signal YB is logic low, and the logical input signal X is logic low (e.g., "logic 0"), the transistor M31 turns on and conducts, and the transistor M32 turns off and does not conduct. Additionally, the transistor M36 turns off and does not conduct, and the transistor M37 turns on and conducts. The voltage at the first output node 510 (and the decoder output D1) is therefore set to about the supply voltage VDD (e.g., a logical high state, logic 1). Current does not flow through the transistor M37 because the transistor M40 is turned off and not conducting.

When the logical input signal X is logic low, the inverse input signal XB is logic high. When the logical input signal Y is logic high (e.g., enabling the decoder), the inverse input signal YB is set to logic low, and the inverse input signal XB is logic high (e.g., "logic 1"), the transistor M33 turns off and does not conduct, the transistor M34 turns on and conducts, the transistor M38 turns on and conducts, and the transistor M39 turns off and does not conduct. Because the transistor M35 is also turned on and conducting, the voltage at the second output node 512 (the decoder output D2) is set to the voltage VSS (e.g., a logical low state, logical 0, the ground voltage, etc.). Current does not flow between the first and second output nodes 512 and 514 because the shared transistor M41 is turned off and not conducting when the input signal Y is in the logic high state. Because the transistor M38 is turned on and the transistor M39 is turned off, the voltage at the fourth output node 516 (the decoder output D4) is set to logic high (e.g., about VDD). Current flows between the fourth output node 516 and the third output node 514 because the transistor M42 is turned on and conducting, and therefore the third output node 514 (the decoder output D3) is also set to logic high.

When the logical input signal Y is logic high, the inverse input signal YB is set to logic low, and the logical input signal X is logic high (e.g., "logic 1"), the transistor M31 turns off and does not conduct, and the transistor M32 turns on and conducts. Additionally, the transistor M36 turns off and does not conduct, and the transistor M37 turns on and conducts. Because the footer transistor M35 is turned on and conducting, the voltage at the first output node 510 is set to about the second voltage VSS (e.g., a logical low state, logic 0). Current does not flow through the transistor M37 because the footer transistor M40 is turned off and not conducting.

When the logical input signal X is logic high, the inverse input signal XB is logic low. When the logical input signal Y is logic high, the inverse input signal YB is set to logic low, and the inverse input signal XB is logic low (e.g., "logic 0"), the transistor M33 turns on and conducts, the transistor M34 turns off and does not conduct, the transistor M38 turns on and conducts, and the transistor M39 turns off and does not conduct. The voltage at the second output node 512 and the fourth output node 516 are set to the supply voltage VDD (e.g., a logical high state, logical 1). Current does not flow between the first and second output nodes 510 and 512 because the shared transistor M41 is turned off and not conducting when the logical input signal Y is in the logic high state. Current flows between the third and fourth output nodes 514 and 516 because the transistor M42 is turned on and conducting when the inverse input signal YB is in the logical low state, thereby setting the third output node 514 to the logical high state.

When the logical input signal Y is set to a logical low, the inverse logical signal YB is set to logical high. This causes the footer transistor M35 to turn off and not conduct, the shared transistor M41 to turn on and conduct, the footer transistor M40 to turn on and conduct, and the shared transistor M42 to turn off and not conduct. When the logical input signal Y is logic low, the inverse logical signal YB is set to logical high, and the logical input signal X is logic low, the transistor M31 turns on and conducts, the transistor M32 turns off and does not conduct, the transistor M36 turns on and conducts, and the transistor M37 turns off and does not conduct. The voltage at the first output node 510 and the third output node 514 are therefore set to about the supply voltage VDD (e.g., a logical high state, logic 1).

When the logical input signal X is logic low, the inverse input signal XB is logic high. When the logical input signal Y is logic low, the inverse logical signal YB is set to logical high, and the inverse input signal XB is logic high, the transistor M33 turns off and does not conduct, the transistor M34 turns on and conducts, the transistor M38 turns off and does not conduct, and the transistor M39 turns on and conducts. However, the transistor M35 is also turned off because the input signal Y is logic low. Current flows between the first and second output nodes 510 and 512 because the shared transistor M41 is turned on and conducting, therefore setting the voltage at the second output node 512 to logic high (e.g., the voltage VDD). The transistor M40 is turned on and conducting, and therefore, the voltage at the fourth output node 516 is set to the voltage VSS (e.g., logic low). Current does not flow between the third and fourth output nodes 514 and 516 because the transistor M42 is turned off and not conducting.

When the logical input signal Y is logic low, the inverse logical signal YB is set to logical high, and the logical input signal X is logic high (e.g., "logic 1"), the transistor M31 turns off and does not conduct, the transistor M32 turns on and conducts, the transistor M36 turns off and does not conduct, and the transistor M37 turns on and conducts. However, the footer transistor M35 is turned off and not conducting, and therefore current does not flow through the transistor M2, and the transistor M40 is turned off and not conducting, thereby setting the voltage at the third output node 514 is set to the logic low state (e.g., the voltage VSS). When the logical input signal X is logic high, the inverse input signal XB is logic low.

When the logical input signal Y is logic low, the inverse logical signal YB is set to logical high, and the inverse input signal XB is logic low (e.g., "logic 0"), the transistor M33 turns on and conducts, the transistor M34 turns off and does not conduct, the transistor M38 turns on and conducts, and the transistor M39 turns off and does not conduct. The voltage at the second output node 512 is therefore set to the supply voltage VDD (e.g., a logical high state, logical 1). Current flows between the first and second output nodes 512 and 514 because the shared transistor M41 is turned on and conducting when the input signal Y is in the logic low state. The voltage at the fourth output node 516 is therefore set to the logic high state. Current does not flow between the third and fourth output nodes 514 and 516 because the shared transistor M42 is turned off when the inverse input signal YB is logic high state.

Figure 6:
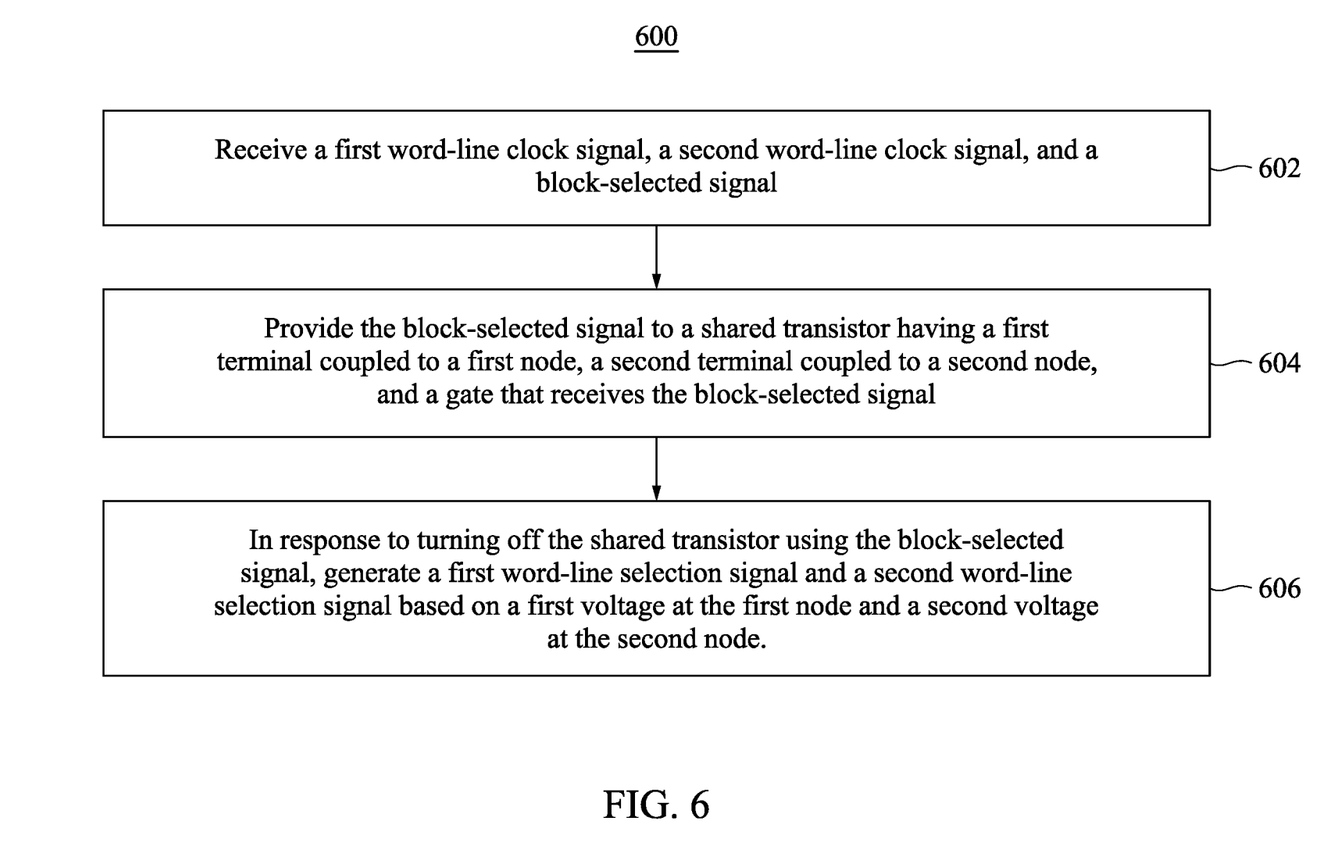
FIG. 6 illustrates a flowchart of an example method to operate the disclosed decoder circuits having shared transistors, in accordance with some embodiments of the present disclosure.

FIG. 6 illustrates a flowchart of an example method 600 to operate an example word-line decoder circuit having shared transistors, in accordance with some embodiments of the present disclosure. The method 600 may be used to operate a word-line decoder circuit (e.g., the circuit 300, etc.). For example, at least some of the operations described in the method 600 use layouts and schematics described in FIGS. 1-5. It is noted that the method 600 is merely an example and is not intended to limit the present disclosure. Accordingly, it is understood that additional operations may be provided before, during, and after the method 600 of FIG. 6, and that some other operations may only be briefly described herein.

In brief overview, the method 600 starts with operation 602 of receiving a first word-line clock signal, a second word-line clock signal, and a block-selected signal. The method 600 proceeds to operation 604 of providing the block-selected signal to a shared transistor having a first terminal coupled to a first node, a second terminal coupled to a second node, and a gate that receives the block-selected signal. In response to turning off the shared transistor using the block-selected signal, the method 600 proceeds to operation 606 of generating a first word-line selection signal and a second word-line selection signal based on a first voltage at the first node and a second voltage at the second node.

Referring to operation 602, a first word-line clock signal (e.g., the input clock signal X0[0]), a second word-line clock signal (e.g., the input clock signal X0[1]), and a block-selected signal (e.g., the signal at the node 316 of the circuit 300) are received. The block-selected signal may be generated by at least one logic gate, such as the by the NOR gate 312. In one example, the at least one logic gate may receive multiple block-selected signals (e.g., the signals X1B and X2B), and can generate an output that indicates whether the word-lines corresponding to the word-line circuit are selected.

Referring to operation 604, the block-selected signal is provided to a shared transistor (e.g., the shared transistor M21, the shared transistor M22, etc.) having a first terminal coupled to a first node (e.g., the node 320, the node 324), a second terminal coupled to a second node (e.g., the node 322, the node 326, etc.), and a gate that receives the block-selected signal. In an embodiment, an inverter can generate an inverted block-selected signal, which can be utilized to source an NMOS transistor complementary NMOS and PMOS transistors that are gated with one of the first word-line clock signal or the second word-line clock signal, with the drains of the complementary NMOS and PMOS transistors coupled to one of the first or second nodes.

Referring to operation 606, in response to turning off the shared transistor using the block-selected signal, generating a first word-line selection signal (e.g., the word-line signal WL[0]) and a second word-line selection signal (e.g., the word-line signal WL[1]) based on a first voltage at the first node and a second voltage at the second node. The first voltage at the first node and the second voltage at the second node can be generated by respective sets of complementary NMOS and PMOS transistors that are arranged in series and gated the first word-line clock signal the second word-line clock signal, respectively. The drains of each set of the complementary NMOS and PMOS transistors are electrically coupled to the first and second nodes. The PMOS transistors of each set of complementary NMOS and PMOS transistors are sourced with a supply voltage.

In one aspect of the present disclosure, a decoder device is disclosed. The decoder device includes a first logic gate configured to receive a disable signal and a first input signal, and generate a first decoder output signal at a first output node. The decoder device includes a second logic gate configured to receive the disable signal and a second input signal, and generate a second decoder output signal at a second output node. The first logic gate and the second logic gate share a transistor. The transistor has a first terminal coupled to the first output node, a second terminal coupled to the second output node, and a gate terminal that receives the disable signal.

In another aspect of the present disclosure, a circuit is disclosed. The circuit includes a first PMOS transistor and a second PMOS transistor. The first PMOS transistor is gated with a first word-line clock signal and the second PMOS transistor is gated with a second word-line clock signal. The first and second PMOS transistors are sourced with a supply voltage. The circuit includes a first NMOS transistor gated with the first word-line clock signal. The first NMOS transistor is drained with a drain of the first PMOS transistor at a first node. The circuit includes a second NMOS transistor gated with the second word-line clock signal. The second NMOS transistor is drained with a drain of the second PMOS transistor at a second node. The circuit includes a third PMOS transistor sourced at the first node, drained at the second node, and gated with an enable signal.

In yet another aspect of the present disclosure, a method is disclosed. The method includes receiving a first word-line clock signal, a second word-line clock signal, and a block-selected signal. The method includes providing the block-selected signal to a shared transistor having a first terminal coupled to a first node, a second terminal coupled to a second node, and a gate that receives the block-selected signal. The method includes, in response to turning off the shared transistor using the block-selected signal, generating a first word-line selection signal and a second word-line selection signal based on a first voltage at the first node and a second voltage at the second node.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A decoder device, comprising:
  a first logic gate configured to receive a disable signal and a first input signal, and generate a first decoder output signal at a first output node;
  a second logic gate configured to receive the disable signal and a second input signal, and generate a second decoder output signal at a second output node,
  wherein the first logic gate and the second logic gate share a transistor, the transistor having a first terminal coupled to the first output node, a second terminal coupled to the second output node, and a gate terminal that receives the disable signal.

2. The decoder device of claim 1, wherein the first logic gate and the second logic gate each include a NAND gate.

3. The decoder device of claim 2, wherein the first logic gate and the second logic gate share a second transistor having a first terminal coupled to a ground voltage and a gate terminal that receives the disable signal.

4. The decoder device of claim 1, wherein the first logic gate and the second logic gate each include a NOR gate.

5. The decoder device of claim 4, wherein the first logic gate and the second logic gate share a second transistor having a first terminal coupled to a supply voltage and a gate terminal that receives the disable signal.

6. The decoder device of claim 1, wherein the disable signal turns on the transistor, causing the voltage at the first output node to be about equal to the voltage at the second output node.

7. The decoder device of claim 1, wherein the first logic gate and the second logic gate are each a three-input gate that receives a second disable signal.

8. The decoder device of claim 7, wherein the first logic gate and the second logic gate share a second transistor having a first terminal coupled to the first output node, a second terminal coupled to the second output node, and a gate terminal that receives the second disable signal.

9. The decoder device of claim 1, wherein the second input signal is a logical inversion of the first input signal.

10. The decoder device of claim 1, further comprising:
  a third logic gate configured to receive a logical inversion of the disable signal and the first input signal, and generate a third decoder output at a third output node; and
  a fourth logic gate configured to receive the logical inversion of the disable signal and the second input signal, and generate a fourth decoder output at a fourth output node,
  wherein the third logic gate and the fourth logic gate share a second transistor, the second transistor having a first terminal coupled to the third output node, a second terminal coupled to the fourth output node, and a gate terminal that receives the logical inversion of the disable signal.

11. The decoder device of claim 10, wherein the logical inversion of the disable signal turns on the second transistor causes the voltage at the third output node to be about equal to the voltage at the fourth output node.

12. A decoder device, comprising:
a first NAND gate configured to receive a disable signal and a first input signal;
a second NAND gate configured to receive the disable signal and a logical inversion of the first input signal; and
a PMOS transistor comprising a first source/drain terminal coupled to a first output of the first NAND gate, and a second source/drain terminal coupled to a second output of the second NAND gate, wherein the PMOS transistor is gated by the disable signal.

13. The decoder device of claim 12, further comprising an inverter configured to generate the logical inversion of the first input signal.

14. The decoder device of claim 12, further comprising an NMOS transistor coupled to a ground terminal of the first NAND gate and the second NAND gate.

15. The decoder device of claim 12, wherein the PMOS transistor is a first PMOS transistor, and further comprising a second PMOS transistor comprising a third source/drain terminal coupled to the first output of the first NAND gate, and a fourth source/drain terminal coupled to the second output of the second NAND gate.

16. The decoder device of claim 15, further comprising a first NMOS transistor and a second NMOS transistor in series, the first NMOS transistor coupled to a ground terminal of the first NAND gate and the second NAND gate, the second NMOS transistor coupled to a ground voltage.

17. The decoder device of claim 16, wherein the disable signal is a first disable signal, the first NMOS transistor is gated by the first disable signal, and each of the second PMOS transistor and the second NMOS transistor are gated by a second disable signal.

18. A method, comprising:
receiving, by a first logic gate, a first input signal and a disable signal;
receiving, by a gate terminal of a transistor coupled to a first output of the first logic gate and a second output of a second logic gate, the disable signal; and
generating, by the first logic gate and the second logic gate, a first decoder output and a second decoder output, respectively, based on the first input signal and the disable signal.

19. The method of claim 18, further comprising receiving the disable signal at a second gate terminal of a second transistor coupled to a ground voltage and each of the first logic gate and the second logic gate.

20. The method of claim 19, further comprising receiving a second disable signal at a third gate terminal of a third transistor in series with the second transistor.

* * * * *